US007999609B2

(12) United States Patent
Saar et al.

(10) Patent No.: US 7,999,609 B2
(45) Date of Patent: Aug. 16, 2011

(54) MANAGED WIDEBAND RADIO FREQUENCY DISTRIBUTION SYSTEM WITH SIGNAL LEVEL ENABLING INTERFACE DEVICE AND IMPEDANCE SIGNATURE DETECTION

(75) Inventors: David A. Saar, Titusville, NJ (US); Robert D. Stine, Mechanicsburg, PA (US); Earl Hennenhoefer, Carlisle, PA (US); Richard V. Snyder, Harrisburg, PA (US)

(73) Assignee: Z-Band, Inc., Carlisle, PA (US)

( * ) Notice: Subject to any disclaimer, the term of this patent is extended or adjusted under 35 U.S.C. 154(b) by 107 days.

(21) Appl. No.: 12/505,189

(22) Filed: Jul. 17, 2009

(65) Prior Publication Data

US 2009/0280739 A1 Nov. 12, 2009

Related U.S. Application Data

(63) Continuation of application No. PCT/US2008/000734, filed on Jan. 22, 2008, and a continuation of application No. PCT/US2008/008219, filed on Jul. 2, 2008.

(60) Provisional application No. 60/881,171, filed on Jan. 19, 2007, provisional application No. 60/907,769, filed on Apr. 17, 2007, provisional application No. 60/929,548, filed on Jul. 2, 2007.

(51) Int. Cl.
*H03K 17/687* (2006.01)

(52) U.S. Cl. ....................................... 327/603; 333/17.3

(58) Field of Classification Search .................. 333/17.3
See application file for complete search history.

(56) References Cited

U.S. PATENT DOCUMENTS

| | | | | | |
|---|---|---|---|---|---|
| 2,745,067 | A * | 5/1956 | True et al. | .................... | 333/17.1 |
| 3,202,764 | A * | 8/1965 | Adams et al. | ................. | 370/521 |
| 4,493,112 | A * | 1/1985 | Bruene | ......................... | 455/123 |
| 5,889,252 | A * | 3/1999 | Williams et al. | ......... | 219/121.54 |
| 7,522,875 | B1 * | 4/2009 | Gurantz et al. | .............. | 455/3.01 |
| 7,570,111 | B1 * | 8/2009 | Vagher et al. | ................. | 330/126 |
| 7,570,926 | B2 * | 8/2009 | Behzad | ........................... | 455/76 |
| 2003/0210690 | A1 | 11/2003 | Hennenhoefer et al. | | |
| 2005/0273494 | A1 | 12/2005 | Uchide | | |
| 2008/0122553 | A1 * | 5/2008 | McKinzie | .................... | 333/17.3 |

FOREIGN PATENT DOCUMENTS

| | | |
|---|---|---|
| JP | 61-088670 | 5/1986 |
| JP | 05-094671 | 4/1993 |
| JP | 2000-092346 | 3/2000 |
| WO | WO 97/01931 | 1/1997 |

* cited by examiner

*Primary Examiner* — Lincoln Donovan
*Assistant Examiner* — William Hernandez
(74) *Attorney, Agent, or Firm* — Buchanan Ingersoll & Rooney PC

(57) ABSTRACT

A system and method for managing distribution of wideband radio frequency signals includes detecting an impedance signature of a device connected at the end of transmission medium. A switch is opened to apply a wideband radio frequency signal to a transmission medium for distribution. A biasing voltage can be applied to the transmission medium based on the detected impedance signature. A signal conditioning circuit is selected based on the amplitude of the biasing voltage, and the wideband radio frequency signal is distributed to an output device.

21 Claims, 6 Drawing Sheets

100

MANAGED WIDEBAND RADIO FREQUENCY DISTRIBUTION SYSTEM WITH SIGNAL LEVEL ENABLING INTERFACE DEVICE AND IMPEDANCE SIGNATURE DETECTION

RELATED APPLICATIONS

The present application is a continuation of international application No. PCT/US2008/0007034, filed on Jan. 22, 2008 and designating the U.S., and international application No. PCT/US2008/008219, filed on Jul. 2, 2008 and designating the U.S. The present application claims priority to U.S. Provisional Application No. 60/881,171, filed on Jan. 19, 2007; U.S. Provisional Application No. 60/907,769, filed on Apr. 17, 2007; and U.S. Provisional Application No. 60/929,548, filed on Jul. 2, 2007. The entire content of each of these prior applications is incorporated herein by reference.

FIELD

The subject matter of this disclosure involves the management and distribution of wideband radio frequency signals.

BACKGROUND

Radio Frequency (RF) wideband technology has been used to distribute TV signals to businesses and residences. An exemplary installation includes a proprietary coaxial distribution architecture with amplifiers, splitters/taps and equalizers used to balance the system. If the user desires add/on or move, or change to the configuration, the system is redesigned and rebalanced for optimal performance.

The ability to control bidirectionally the distribution of the RF and the signal sets in a systematic plug-in-play fashion over a TIA/EIA 568 standard structured cabling involves specific transmission algorithms. These algorithms address picture quality by providing optimum levels to the video appliances over a wire line (i.e., cable) or wireless media.

Communication services such as voice and data are transported on a global wiring platform standard (e.g., TIA/EIA 568). Proprietary wiring systems (i.e., coaxial cable) are used for the distribution of wideband RF signals or channels. Internet (IP) video, although adaptable to the TLA/EIA 568 standard, can be limited and disruptive to the data network particularly with transport of high definition television channels.

An unshielded twisted pair passive system is not systemic and includes components such as baluns, splitters and amplifiers. This approach can be limited on bandwidth transport and can involve expertise in radio frequency design for large installations. An untwisted pair active system is bandwidth limited but is installation friendly, i.e., no radio frequency experience is necessary.

A passive coaxial system includes components such as coax cable, amplifiers, splitters and signal tabs, and can involve knowledge of radio frequency design to install and balance the system. It can be a proprietary system, not well documented for future reference. A baseband switch system distributes analog baseband signals over unshielded twisted pair cables. The architecture can be star wired back to the switch system in using the unshielded twisted pairs.

Video over IP does utilize the TIA/EIA 568 wiring standard. The video quality is based on the bandwidth available for video applications. If mission critical data applications take higher priority, video quality can be degraded.

SUMMARY

Disclosed is a system for managing distribution of wideband radio frequency signals, including a distribution unit having an input port and an output port for distributing a wideband radio frequency signal over a transmission medium, and an impedance signature detecting device for detecting an impedance signature of a system interface device, wherein the system interface device is connected at a termination point of the transmission medium; a first processor connected to the distribution unit and the impedance signature detecting device for actuating a switch allowing distribution of the wideband radio frequency signal over the transmission medium based on the impedance signature detected by the impedance signature detecting device, and for signaling a direct current biasing device to apply a biasing direct current voltage to the transmission medium, wherein the biasing voltage amplitude is based on the detected impedance signature; a second processor located at the system interface device for detecting the biasing voltage, and for actuating a signal conditioning device based on the amplitude of the biasing voltage that selectively conditions the wideband radio frequency signal for output to an output device connected to the system interface device.

Disclosed is a method for managing distribution of a wideband radio frequency signal, including detecting an impedance signature of a device connected at the end of transmission medium. A switch is opened to a transmission medium thereby applying the wideband radio frequency signal to the transmission medium for distribution. If needed, a biasing voltage is applied to the transmission medium based on the detected impedance signature. A signal conditioning circuit is selected based on the amplitude of the biasing voltage, and the wideband radio frequency signal is distributed to an output device.

BRIEF DESCRIPTION OF THE DRAWING FIGURES

Exemplary embodiments will now be described with reference to the drawings. The following is a brief description of the drawings.

DETAILED DESCRIPTION

Figure 1:
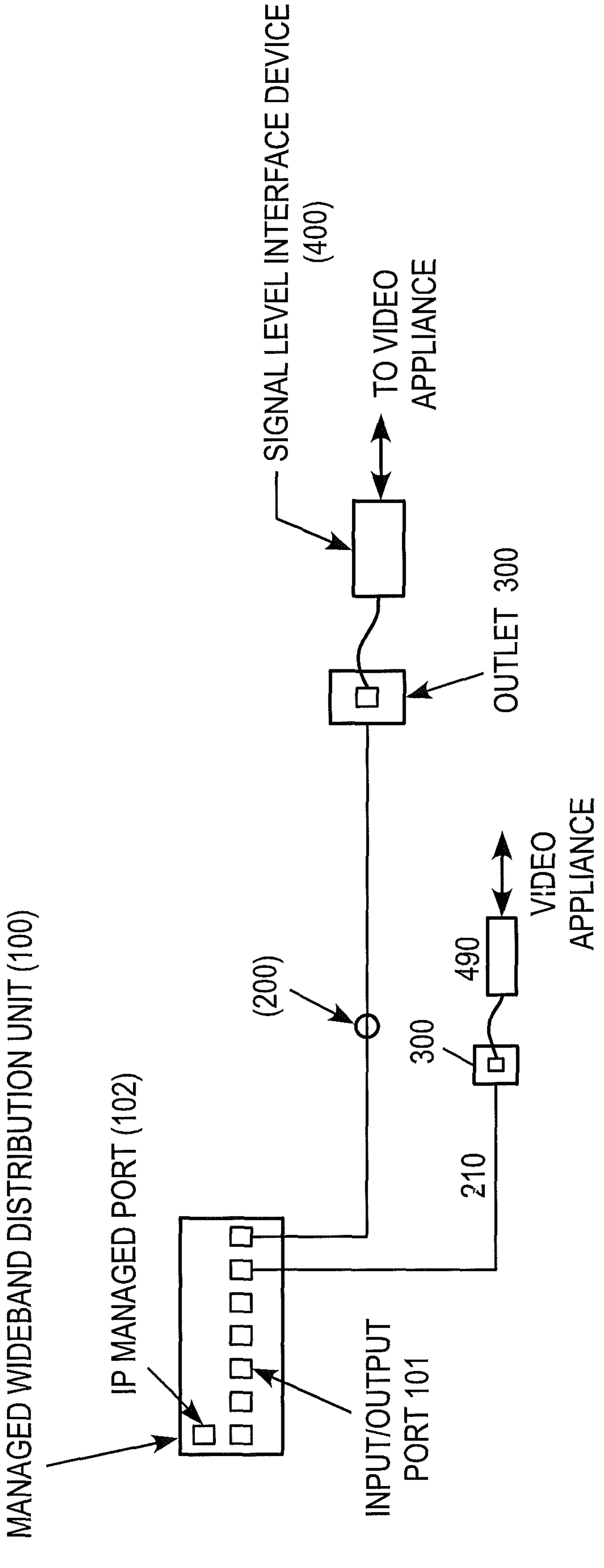
FIG. 1 illustrates the exemplary managed RF wideband distribution system.

FIG. 1 illustrates an exemplary embodiment of the managed RF wideband distribution system with an optimizing signal level interface. The system comprises a distribution unit 100 that has a plurality of input ports and output ports 101 and an IP manage port 102 for distributing wideband radio frequency signals (e.g., high definition television signals and the like) over a transmission medium. The distribution unit 100 can distribute the RF signals over a plurality of cable types 200 such as twisted pairs (TP), coaxial cable 210, fiber optic cables and the like. The cable 200 connects to a plurality of outlets 300 or transmission medium termination points, which can be connected to a signal level interface device 400, balun 490, or other device.

Figure 2A:
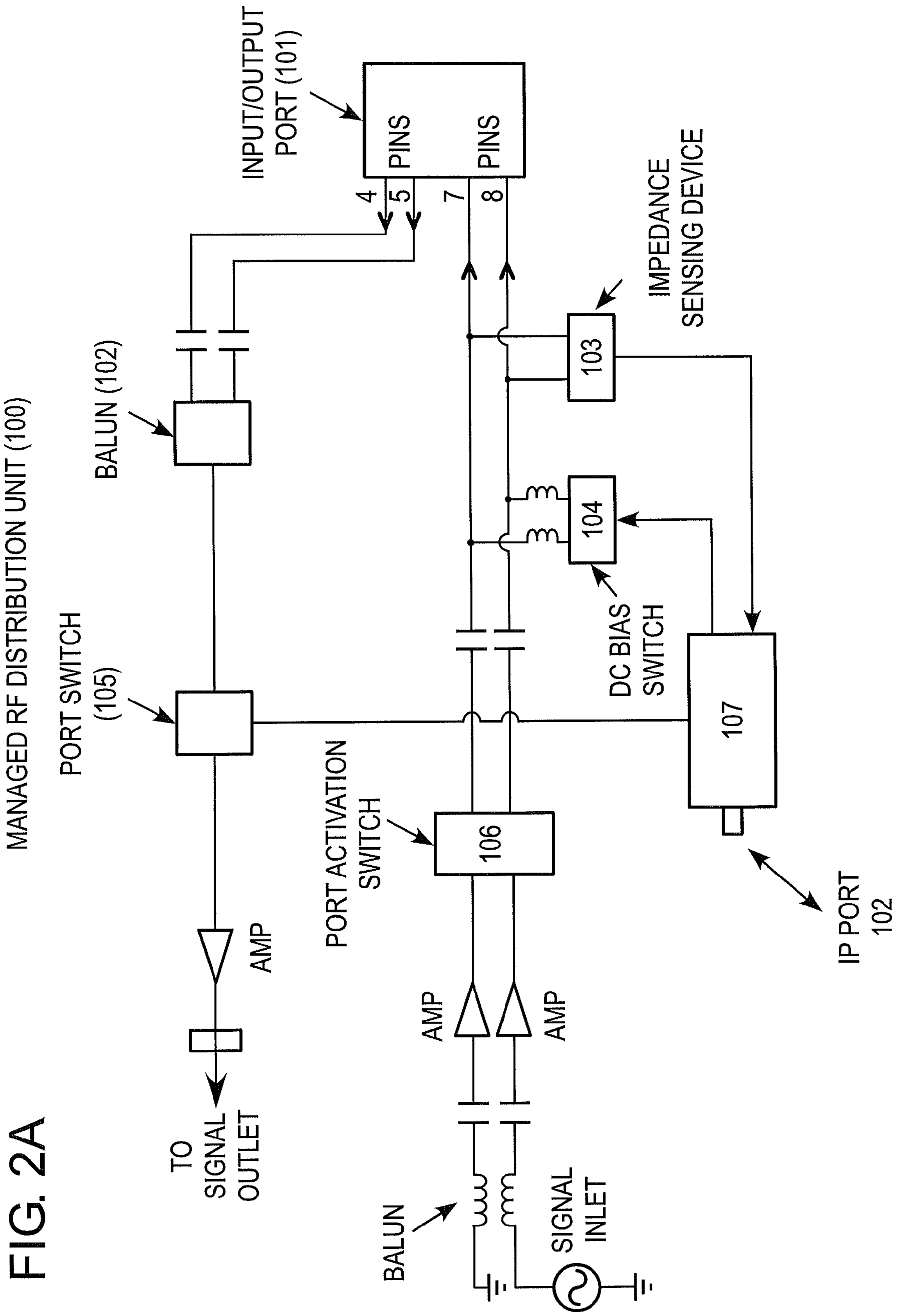
FIGS. 2A to 2C illustrate exemplary schematic diagrams of the managed RF distribution unit.

Referring to FIG. 2A, each input/output port 101 is monitored via an impedance signature detecting device 103. If the impedance signature detecting device 103 detects the presence of a proper impedance signature, for example, 1-100Kohms or more or less, of the signal level interface device 400 or a balun 490 at input/output port 101, typically over pins number 7 and 8 of a connecting plug. The proper impedance signature can be selected as not to interfere with other types of components, such as power over Ethernet devices and the like. The impedance signature is determined by applying a biasing voltage, such as 8 volts or higher or lower to the transmission medium and detecting a voltage over a known impedance of the transmission medium, i.e. the impedance signature, such impedance signature detection techniques are known in the art and are suitable for use in the exemplary embodiments.

When an impedance signature is detected, the impedance signature detecting device 103 outputs a signal to a first processor 107. Based on the signal received from the impedance signature detecting device 103, the first processor 107 activates the DC bias control device 104 and the port activation switch 106. Activation of port activation switch 106 allows the input signal to the distribution unit 100, such as a wideband radio frequency signal, to be distributed over the transmission medium 200.

If the first processor 107 receives a signal from the impedance signature detecting device 103 indicating that a signal level interface device 400 is connected, a direct current biasing voltage is applied to the input/output port 101 to activate the signal level interface device 400 located at a remote location. For example, when the first impedance signature is detected by impedance signature detecting device 103, the device 103 outputs a first signal associated with the first impedance signature of the device (400, 490) connected at the termination of the transmission medium, and when a second impedance signature is detected a second signal is output by device 103. The signal output by the impedance signature detecting device 103 is interpreted by the first processor 107.

Two different impedance signatures can be used to indicate unidirectional or bidirectional application. In other words, a first impedance signature can be used to indicate a unidirectional application, and a second impedance signature can be used to indicate bidirectional application. Using this technique, the signal level interface device 400 can provide an indication, based on its impedance signature, that it is capable of unidirectional or bidirectional application (application being used to indicate the capability to communicate either in one direction or in two-way communication applications). If the signal level interface 400 is defined, based on its impedance signature, as a unit capable of bidirectional application, the first processor 107 can also activate return port switch 105 for return path continuity and bidirectional communication with, for example, connected input devices or entities, such as service providers.

The first processor 107 polls each port for signature status. If the signal received at first processor 107 from impedance signature detecting device 103 indicates a balun 490 is connected to input/output port 101, the first processor 107 does not output a signal to activate DC bias control device 104. Without the proper signal from the impedance signature detecting device, the first processor 107 will not activate the DC bias control device 104 and a DC biasing voltage is not applied to the transmission medium.

An IP browser interface control 102 is also accommodated at distribution unit 100, which allows access and control of the first processor 107. A graphical user interface connected at IP browser interface control 102 in combination with the first processor 107 and signal level interface device 400 provides functions such as unit diagnostics (e.g., monitoring of internal power supply, monitoring pilot tone levels, adjusting signal levels on the CATV input and signal levels on cascade input if the device is in a slave mode, capability to turn individual ports 101 on and off, indication of units status, e.g., on or off, master or slave, and an indication of the switch bandwidth service provisions (e.g., 550 MHz or 860 MHz).

Figure 2B:
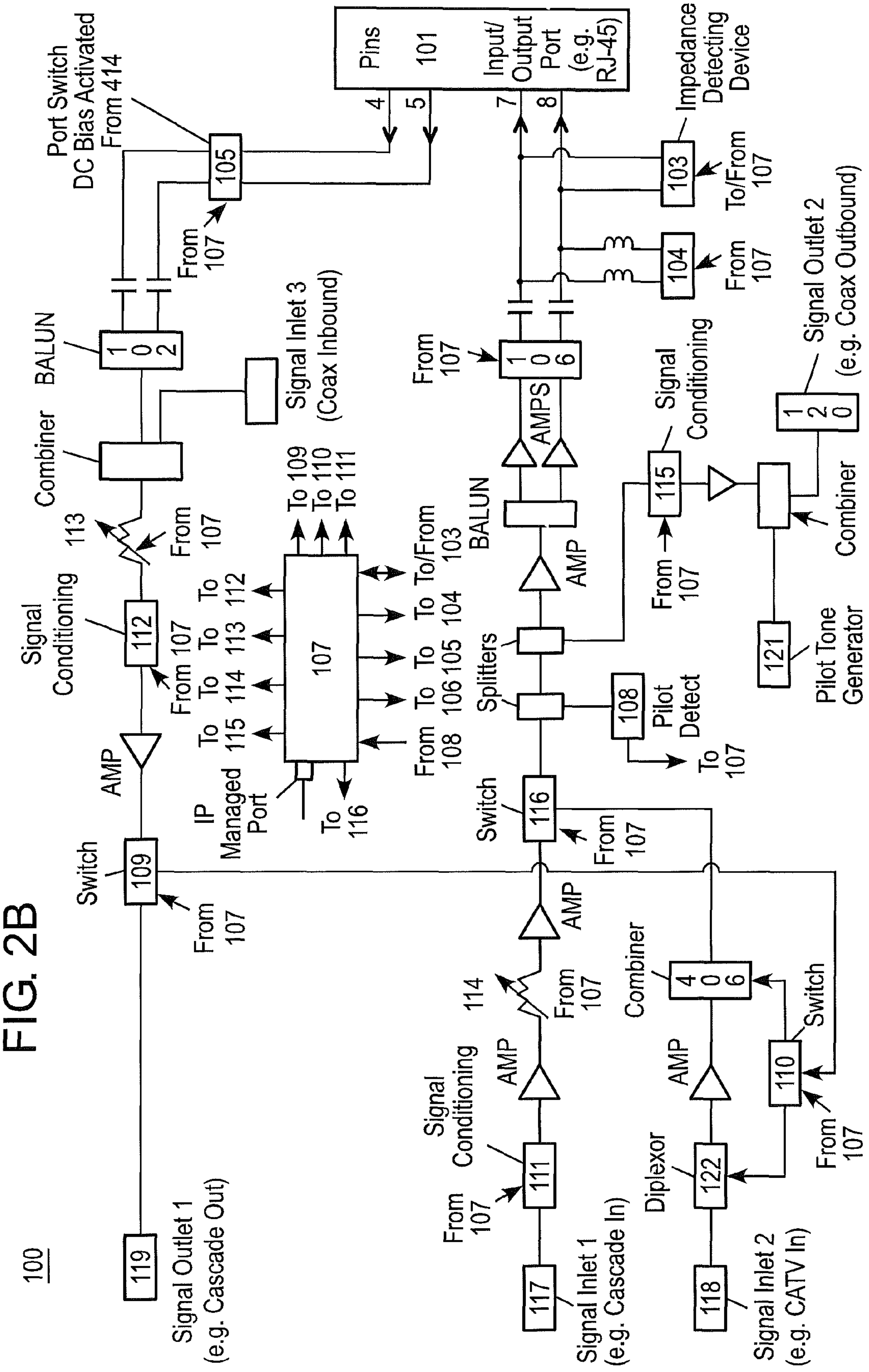

The distribution unit 100 can also condition all incoming and outgoing signals for optimal bandwidth performance. As shown in FIG. 2B, a pilot tone is present at a signal inlet 117 and it will be detected by the pilot detect circuit 108. The tone level information is sent to the first processor 107. The first processor 107 then controls the signal conditioning devices 111, 112, 115 and variable attenuators 114, 113 to process the signal. Signal conditioning can include, among others types of conditioning, simulating input device cable length through the selection of different electrical components, such as resistors, inductors and capacitors. The detected pilot tone can be used by the first processor 107 to control the activation of any one or combination of switches 109, 110, 116. If a pilot tone is present, the switches 109, 110, 116 can configure the distribution unit 100 to operate in a slave mode. The first processor 107 can also configure the distribution unit 100 for a T-channel return on signal inlet 118 of the master unit (not shown). For this T-channel return, switches 109, 110 are activated to provide continuity from a signal conditioning path that includes, for example, signal conditioning device 112 to switch 109 to switch 110 to a diplexor 122, or any other suitable combination of devices.

Figure 2C:
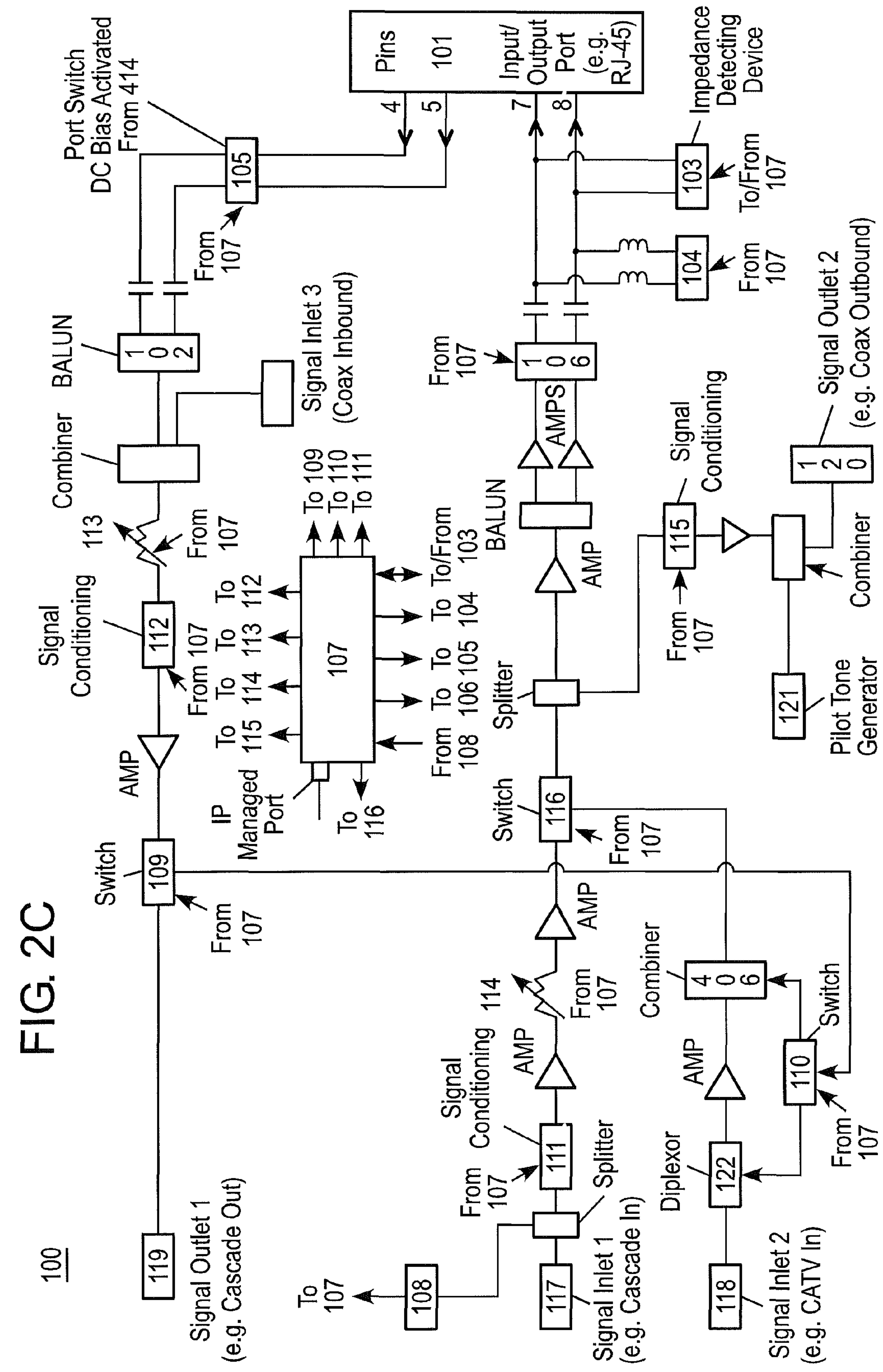

In an alternative exemplary configuration illustrated in FIG. 2C, a splitter can be interposed between the signal inlet 117 and the signal conditioning device 111. This splitter can be connected to the pilot detect circuit 108, which can output tone level information, for example, of the input pilot tone to the first processor 107. Furthermore, in the exemplary configuration illustrated in FIG. 2C, the splitter interposed between the switch 116 and amplifier illustrated in FIG. 2B that is connected to the pilot detect circuit 108 can be dispensed with, such that a single splitter is interposed between the switch 116 and the amplifier, as illustrated in FIG. 2C.

Figure 3:
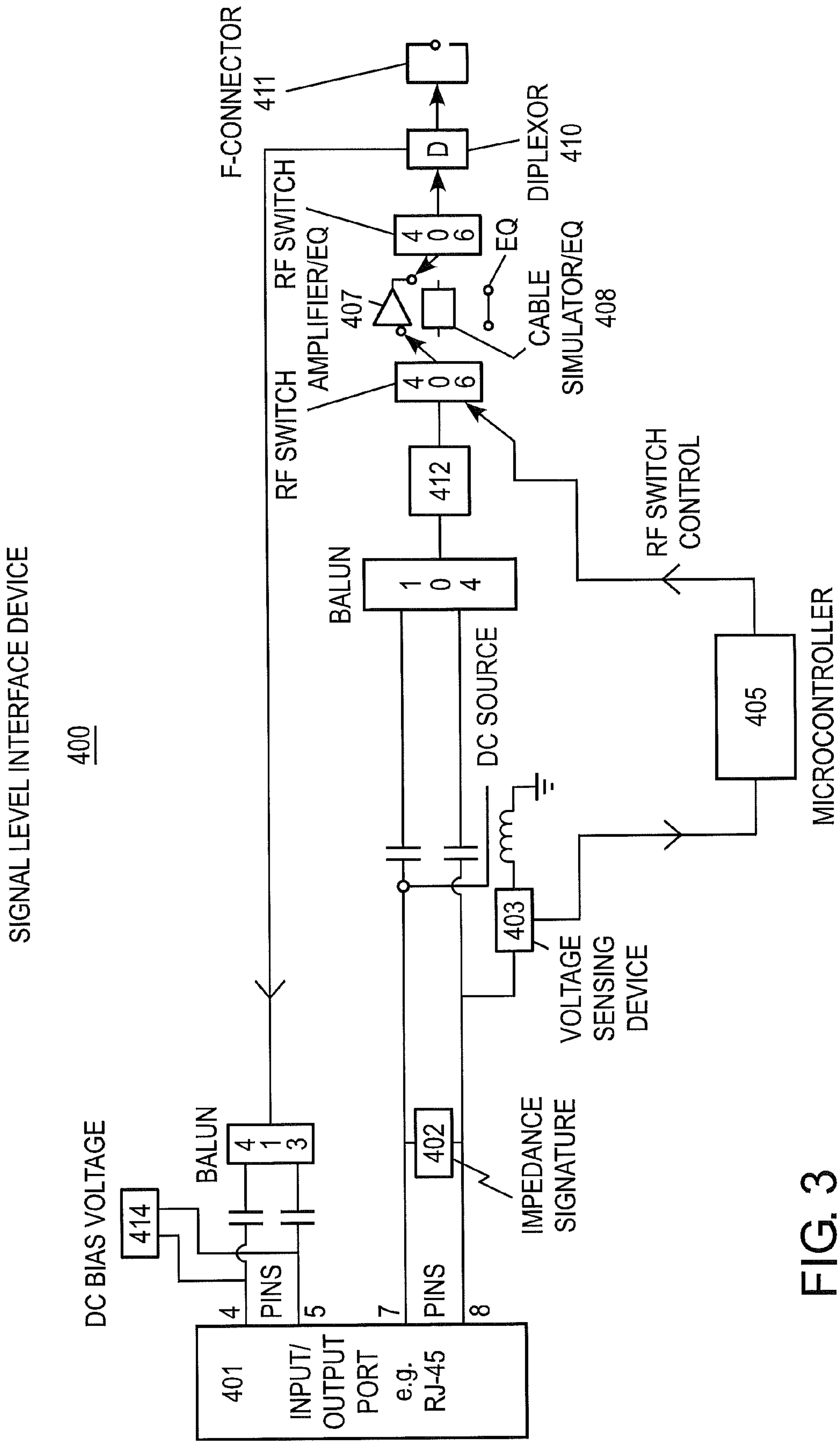
FIG. 3 illustrates an exemplary schematic diagram of the signal level interface device.

FIG. 3 illustrates an exemplary schematic of the signal level interface device 400 as it would appear at a remote location. The signal level interface device 400 supplies an impedance signature 402 which is a voltage having a distinct amplitude in comparison to other voltage signals provided or present at input/output port 401. Input/output port 401 can be a RJ-45 jack although other types of connections can be used. A DC bias voltage 414 may be applied to predetermined connection pins (e.g., pins 4 and 5) of the input/output port 401 to turn on port switch 105 in the distribution unit 100. The interface device 400 receives a DC supply voltage from the distribution unit 100 and provides power to the active devices. The second processor (microcontroller) 405 detects the DC voltage across a known resistor value via voltage sensing device 403. The second processor 405 uses this voltage to determine the distance the device is from the distribution unit. For instance, the distance from the distribution unit can be determined by the voltage drop from a known reference voltage compared at the voltage sensing device 403. The detected amplitude of the biasing voltage corresponds to the distance that a connected device is from the distribution unit 100. This approximates the length of cables 200 and 210. The processor 405 can then select the appropriate signal conditioning device (e.g., amplifier 407, equalizer (EQ) 409, or cable simulation 408, or a combination thereof, by activating the RF switches 406) based on the distance of the connected device from the distribution unit 100. According to an exemplary embodiment, the processor 405 can select the equalizer 409 by itself or in combination with at least one of the amplifier 407 and cable simulation 408, as the appropriate signal condition device. Based on the amplitude of the detected biasing voltage, the wideband radio frequency signal is amplified when the amplitude of the biasing voltage is below a first threshold; the wideband radio frequency is allowed to pass via the equalizer in the signal conditioning circuit, when the amplitude of the biasing voltage is between the first threshold and below a second threshold; and a cable having a known impedance is simulated, when the amplitude of the biasing voltage is above the second threshold.

In more detail, when power is applied to a signal level interface device 400, its processor starts up. After a few milliseconds, a measurement of the supply voltage is taken. Then, a known load (typically the amplifier in the signal level interface device 400) is turned on and a short period later (around another 4 milliseconds) the voltage is measured again. The voltage difference indicates the effective resistance of the cable (R=E/I–Ohms law). If the voltage difference is above a predetermined level, the cable is long and the amplifier is switched into the circuit to the TV. A first LED is turned on to indicate the selection to the installer. If the voltage difference is below a different predetermined level, the cable is short and a cable simulator is switched into the circuit to the TV. A second LED is turned on to indicate the selection. Also, the amplifier may be turned off and a transistor and load resistor turned on instead to provide a different load current which the managed RF wideband distribution unit 100 can detect as indicating that the signal level interface device 400 has selected the cable simulator. If the voltage difference is between the two predetermined levels, the cable is medium in length and the signal can be equalized to turn the TV on. A third LED is turned on to indicate the selection. As described above, the amplifier may be turned off and a different transistor and load resistor turned on to provide a different load current, which the managed RF wideband distribution unit 100 can detect as indicating that the signal level interface device 400 has selected to equalize the signal. If the alternate loads are implemented, the managed RF wideband distribution system 100 can report (e.g., by software recorded and executed by a processor of the managed RF wideband distribution system, an indicator device such as a LED or display device, etc.) the selection made by the signal level interface device 400 of cable simulator, equalizer, amplifier, or any combination thereof. In the exemplary embodiment described above, three LEDs are included to indicate the identified selections. The present disclosure is not limited to this number of LEDs and may include any combination of LEDs or other notification device (e.g., display device) to appropriately indicate the aforementioned and other identifications. In addition, the present disclosure is not limited to the illustrated arrangement of attenuation and amplification elements. Other combinations of attenuation and amplification elements may be included to achieve the aforementioned functions.

The distribution unit 100, the first processor 107, and/or the second processor 405 are controllable by a graphical user interface (not shown) via an IP managed port. The graphical user interface controls any one or any combination of the following functions: turning on/off individual ports, checking status (power on/off, master or slave mode), monitoring internal power supply voltage levels, checking channel levels on a cable television (CATV) input and cascade input, when in slave mode, and switching a bandwidth filter on to change the service offering (e.g., 860 MHz to 550 MHz), as well as other functions as desired by a user.

The signal level interface device 400 can also provide impedance matching 404 and equalization 412. The input signal having a given bandwidth, for example, 54-860 Mhz or higher or lower, passes through a diplexor 410 to connector 411, such as an F-connector or other suitable connector. Devices that can be connected to the connector 411 can be a high definition compatible television set, a USB-connected computer having a television tuning card, or a similar device capable of receiving wideband radio frequency signals.

The diplexor 410, acting like a high-pass/low-pass filter, can direct a portion of the input signal having a lower frequency range, such as between 5-47 Mhz or higher or lower, to the output pins (e.g., 4 and 5) to outlet 300 to which the signal level device 400 is connected. The lower frequency range return signal communicates information back to the distribution unit 100 as part of the bidirectional communication discussed above. The lower frequency range return signal allows for communication so that additional services can be provided or information exchanged, for example, with the service provider equipment such as set-top boxes, pay-per-view, and the like.

Powering of the signal level interface device 400 and managed RF wideband distribution system 100 output amplifiers can be accomplished in the following manner.

The processor in the managed RF wideband distribution unit 100 controls power to the individual ports to the signal level interface devices, controls power to the amplifiers for each port, and reads the current drawn by the signal level interface device attached to each port. After startup, the managed RF wideband distribution unit 100 processor turns on power to the port to the signal level interface device. This causes the microcontroller in the signal level interface device to start up and detect the effective length of the wire to it as described below. The signal level interface device 400 turns on a load (the amplifier or another load) after a brief period.

The processor in the managed RF wideband distribution unit 100 measures the current drawn after a fixed interval, such as 10 milliseconds, for example. If the current is in a certain range, for example, 40 to 75 mA, the device connected is considered to be a signal level interface device 400 and the supply current in the managed RF wideband distribution unit 100 is left on and power is applied to the amplifier for that port. This current draw is the "signature". If the current is out of the certain range (too high or too low), the load is considered not to be a signal level interface device 400 and the power is turned off.

Once a signal level interface device 400 is detected, the current drawn is measured periodically, for example, once every one or two seconds. If the current goes to zero, or is otherwise outside of the selected range, for example, too low or too high, power is removed from the port and the amplifier because it is assumed that the signal level interface device has been removed, or there is a cable problem or some other problem.

The processor on the managed RF wideband distribution unit 100, which can be located on the main board, for example, records the presence or absence of a signal level interface device 400, or a non-valid signature is detected. This information is available externally via the Ethernet or USB port, for example.

Figure 4:
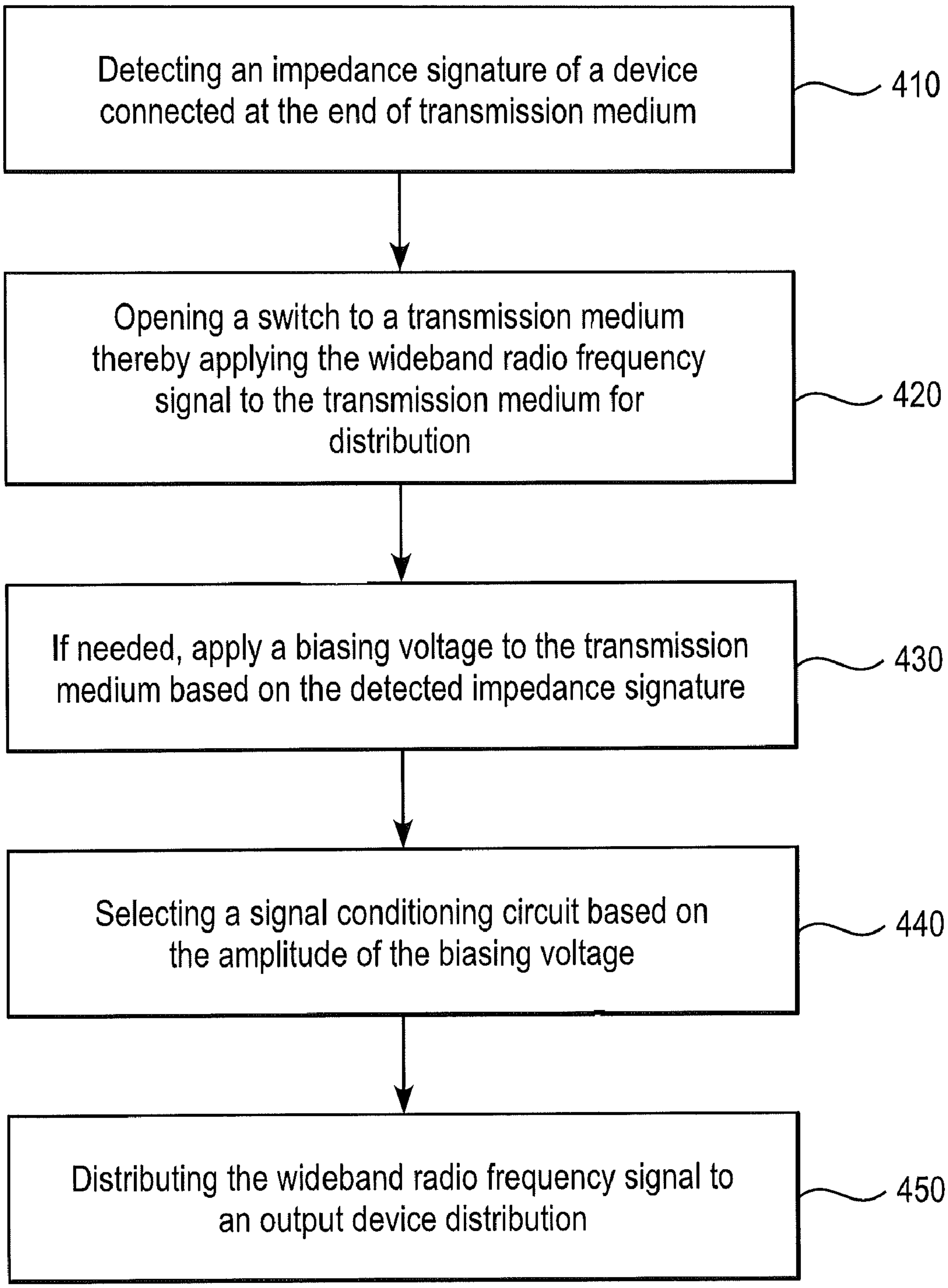
FIG. 4 is a flowchart of an exemplary process for managing the distribution of wideband radio frequency signals.

FIG. 4 is a flowchart of an exemplary method for managing the distribution of wideband radio frequency signals over a transmission medium. In step 410, a device, such as impedance signature detecting device 103, detects an impedance signature of a device connected at a termination point of a transmission medium. Based on the detected impedance signature (i.e., a signal output from the device), a switch connects the distribution unit 100 to a transmission medium thereby applying the wideband radio frequency signal to the transmission medium for distribution (Step 420). In addition, a DC biasing voltage is applied to the transmission medium based on the detected impedance signature (Step 430). Based on the amplitude of the applied DC biasing voltage, a device connected at the termination of the transmission medium selects a signal conditioning process. The signal conditioning process can include one of allowing the wideband radio frequency signal to pass without change, simulating an impedance (e.g., shunt capacitors, series inductance, resistance, or other suitable device or combination of devices) and other characteristics of a particular type of cable to simulate a desired length of the cable, amplifying the signal, or other suitable signal conditioning technique as desired (Step 440). Once the signal conditioning process is performed, the wideband radio frequency signal is distributed to an output device, such as a high-definition monitor or television, computer system, game console, or other similar device as desired (Step 450).

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A system for managing distribution of wideband radio frequency signals, comprising:

a distribution unit having an input port and an output port for distributing a wideband radio frequency signal over a transmission medium, and an impedance signature detecting device for detecting an impedance signature of a system interface device, wherein the system interface device is connected at a termination point of the transmission medium;

a first processor connected to the distribution unit and the impedance signature detecting device for actuating a switch allowing distribution of the wideband radio frequency signal over the transmission medium based on the impedance signature detected by the impedance signature detecting device, and for signaling a direct current biasing device to apply a biasing direct current voltage to the transmission medium, wherein the biasing voltage amplitude is based on the detected impedance signature; and a second processor located at the system interface device for detecting the biasing voltage, and for actuating a signal conditioning device based on the amplitude of the biasing voltage that selectively conditions the wideband radio frequency signal for output to an output device connected to the system interface device wherein the system interface device is configured to indicate a selection of the signal condition device by applying alternate loads to indicate the selection.

2. The system of claim 1, wherein the first processor, based on the detected impedance signature, actuates a switch allowing for signal communication from the output device to other devices connected to the distribution unit.

3. The system of claim 1, wherein the distribution unit, the first processor, and the second processor are controllable via a graphical user interface.

4. The system of claim 1, wherein the signal conditioning device selectively conditions the signal by at least one of amplifying the wideband radio frequency signal, simulating a cable, and equalizing the wideband radio frequency signal.

5. The system of claim 1 comprising:

a cable transmission medium outlet.

6. The system of claim 5, wherein the cable transmission medium is any one or combination of a twisted pair, Ethernet cable, coaxial cable, or fiber optic cable.

7. The system of claim 1, wherein at least one of the distribution unit and the first processor are controllable by a graphical user interface via an IP managed port.

8. The system of claim 7, wherein the graphical user interface controls any one or combination of turning on/off individual ports, checking status, monitoring internal power supply voltage levels, checking channel levels on a cable television input and cascade input, when in slave mode, and switching a bandwidth filter on to change the service offering.

9. The system of claim 1, comprising:

a pilot detect circuit configures the distribution unit to a master or slave mode via the first processor.

10. The system of claim 1, comprising:

a pilot detect circuit that controls the signal conditioning devices on the signal inlets and outlets in the distribution unit via the first processor.

11. A system for managing distribution of wideband radio frequency signals, comprising:

a distribution unit having an input port and an output port for distributing a wideband radio frequency signal over a transmission medium, and an impedance signature detecting device for detecting an impedance signature of a system interface device, wherein the system interface device is connected at a termination point of the transmission medium;

a first processor connected to the distribution unit and the impedance signature detecting device for actuating a switch allowing distribution of the wideband radio frequency signal over the transmission medium based on the impedance signature detected by the impedance signature detecting device, and for signaling a direct current biasing device to apply a biasing direct current voltage to the transmission medium, wherein the biasing voltage amplitude is based on the detected impedance signature;

a second processor located at the system interface device for detecting the biasing voltage, and for actuating a signal conditioning device based on the amplitude of the biasing voltage that selectively conditions the wideband radio frequency signal for output to an output device connected to the system interface device; and an indicator device configured to output indication of a selection of the signal condition device by the system interface device.

12. The system of claim 11, wherein the first processor, based on the detected impedance signature, actuates a switch allowing for signal communication from the output device to other devices connected to the distribution unit.

13. The system of claim 11, wherein the distribution unit, the first processor, and the second processor are controllable via a graphical user interface.

14. The system of claim 11, wherein the signal conditioning device selectively conditions the signal by at least one of amplifying the wideband radio frequency signal, simulating a cable, and equalizing the wideband radio frequency signal.

15. The system of claim 11 comprising:

a cable transmission medium outlet.

16. The system of claim 15, wherein the cable transmission medium is any one or combination of a twisted pair, Ethernet cable, coaxial cable, or fiber optic cable.

17. The system of claim 11, wherein at least one of the distribution unit and the first processor are controllable by a graphical user interface via an IP managed port.

18. The system of claim 17, wherein the graphical user interface controls any one or combination of turning on/off individual ports, checking status, monitoring internal power supply voltage levels, checking channel levels on a cable television input and cascade input, when in slave mode, and switching a bandwidth filter on to change the service offering.

19. The system of claim 11, comprising:

a pilot detect circuit configures the distribution unit to a master or slave mode via the first processor.

20. The system of claim 11, comprising:

a pilot detect circuit that controls the signal conditioning devices on the signal inlets and outlets in the distribution unit via the first processor.

21. The system of claim 11, wherein the system interface device is configured to indicate a selection of the signal condition device by applying alternate loads to indicate the selection.

* * * * *